United States Patent
Park et al.

(10) Patent No.: US 8,934,298 B2
(45) Date of Patent: Jan. 13, 2015

(54) NONVOLATILE MEMORY DEVICE AND RELATED PROGRAMMING METHOD

(75) Inventors: Sang-Soo Park, Hwaseong-Si (KR); Jae-Yong Jeong, Yongin-Si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 147 days.

(21) Appl. No.: 13/600,361

(22) Filed: Aug. 31, 2012

(65) Prior Publication Data

US 2013/0088917 A1    Apr. 11, 2013

(30) Foreign Application Priority Data

Oct. 5, 2011 (KR) .......................... 10-2011-0101434

(51) Int. Cl.
*G11C 11/34* (2006.01)
*G11C 11/56* (2006.01)
*G11C 16/04* (2006.01)
*G11C 16/10* (2006.01)
*G11C 16/12* (2006.01)

(52) U.S. Cl.
CPC ........ *G11C 11/5628* (2013.01); *G11C 16/0483* (2013.01); *G11C 16/10* (2013.01); *G11C 16/12* (2013.01)
USPC ............. 365/185.03; 365/185.02; 365/185.19

(58) Field of Classification Search
CPC ............... G11C 2211/5641; G11C 2211/5621; G11C 16/3459; G11C 11/5628; G11C 11/5642; G11C 11/5621; G11C 16/0483; G06F 11/1072

USPC ............. 365/185.03, 185.19, 185.26, 185.22, 365/185.27, 185.29, 185.17, 185.02
See application file for complete search history.

(56) References Cited

U.S. PATENT DOCUMENTS

| 6,522,580 B2* | 2/2003 | Chen et al. ............... 365/185.02 |
| 7,656,710 B1* | 2/2010 | Wong ........................ 365/185.19 |
| 2008/0144370 A1* | 6/2008 | Park et al. ................. 365/185.03 |
| 2010/0254188 A1* | 10/2010 | Ohsuk et al. ............. 365/185.03 |

FOREIGN PATENT DOCUMENTS

| JP | 2004-185658 | 7/2004 |
| KR | 1020100088468 | 6/2010 |
| KR | 1020100107291 A | 10/2010 |

* cited by examiner

*Primary Examiner* — Toan Le
*Assistant Examiner* — Ajay Ojha
(74) *Attorney, Agent, or Firm* — Volentine & Whitt, PLLC

(57) ABSTRACT

A nonvolatile memory device is programmed by performing a plurality of program loops each comprising sequentially applying first through n-th program pulses (n>1) to a selected wordline connected to a page of memory cells to be programmed, and incrementing each of the first through n-th program pulses prior to a next program loop, wherein the first through n-th program pulses are used to program selected memory cells to respective first through n-th program states, and during application of an i-th program pulse among the first through n-th program pulses (1<i<n), applying a program inhibit voltage to bitlines connected to selected memory cells to be programmed to the first through (i−1)-th program states and applying a program permission voltage to bitlines connected to selected memory cells to be programmed to the i-th through n-th program states.

20 Claims, 15 Drawing Sheets

NONVOLATILE MEMORY DEVICE AND RELATED PROGRAMMING METHOD

CROSS-REFERENCE TO RELATED APPLICATIONS

This application claims priority under 35 U.S.C. §119 to Korean Patent Application No. 10-2011-0101434 filed on Oct. 5, 2011, the disclosure of which is hereby incorporated by reference in its entirety.

BACKGROUND OF THE INVENTION

The inventive concept relates generally to electronic memory technologies. More particularly, the inventive concept relates to nonvolatile memory devices and related programming methods capable of providing reduced power consumption.

There is an ever increasing demand for nonvolatile memory devices having higher storage capacity and faster performance. There is also a continuing need to limit power consumption for various reasons, such as temperature regulation, energy cost, limited battery life of some devices, and others.

Most nonvolatile memory devices exhibit a general tradeoff between storage capacity and/or performance and power consumption. In other words, as storage capacity and/or performance increases, power consumption tends to increase accordingly. As a result, researchers are engaged in continuing efforts to reduce or minimize power consumption in nonvolatile memory devices, especially those on the leading edge of storage capacity and performance.

SUMMARY OF THE INVENTION

According to an embodiment of the inventive concept, a method of programming a nonvolatile memory device comprises in each of a plurality of program loops of an incremental step pulse programming (ISPP) process, sequentially applying a first program pulse and a second program pulse to a wordline connected to selected memory cells, wherein each of the first and second program pulses corresponds to one of first through n-th program states of the selected memory cells, during application of the first program pulse to the wordline, applying a program permission voltage to a first bitline connected to a first memory cell among the selected memory cells, subsequent to application of the first program pulse to the wordline, applying an inhibit voltage to the first bitline, and during application of the inhibit voltage to the first bitline, applying the second program pulse to the wordline and applying the program permission voltage to a second bitline connected to a second memory cell among the selected memory cells.

According to another embodiment of the inventive concept, a method of programming a nonvolatile memory device comprises performing a plurality of program loops each comprising sequentially applying first through n-th program pulses (n>1) to a selected wordline connected to a page of memory cells to be programmed, and incrementing each of the first through n-th program pulses prior to a next program loop, wherein the first through n-th program pulses are used to program selected memory cells to respective first through n-th program states, and during application of an i-th program pulse among the first through n-th program pulses (1<i<n), applying a program inhibit voltage to bitlines connected to selected memory cells to be programmed to the first through (i−1)-th program states and applying a program permission voltage to bitlines connected to selected memory cells to be programmed to the i-th through n-th program states.

According to another embodiment of the inventive concept, a nonvolatile memory device comprises a memory cell array comprising a plurality of memory cells, and a controller configured to perform a plurality of program loops each comprising sequentially applying first through n-th program pulses (n>1) to a selected wordline connected to a page of memory cells to be programmed, and during application of an i-th program pulse among the first through n-th program pulses (1<i<n), applying a program inhibit voltage to bitlines connected to selected memory cells to be programmed to the first through (i−1)-th program states and applying a program permission voltage to bitlines connected to selected memory cells to be programmed to the i-th through n-th program states, wherein the first through n-th program pulses are used to program selected memory cells to respective first through n-th program states.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

The terminology used herein is for the purpose of describing particular embodiments only and is not intended to limit the inventive concept. As used herein, the singular forms "a", "an" and "the" are intended to encompass the plural forms as well, unless the context clearly indicates otherwise. Terms such as "comprises", "comprising", "includes" and "including" indicate the presence of stated features but do not preclude the presence or addition of other features. The term "and/or" indicates any and all combinations of one or more of the associated listed items.

The terms 'first', 'second', 'third', etc., may be used herein to describe various features, but the described features are not to be limited by these terms. Rather, these terms are used merely to distinguish between different features. Thus, a first feature discussed below could be alternatively termed a second element and vice versa without changing the meaning of the relevant description.

Figure 1:
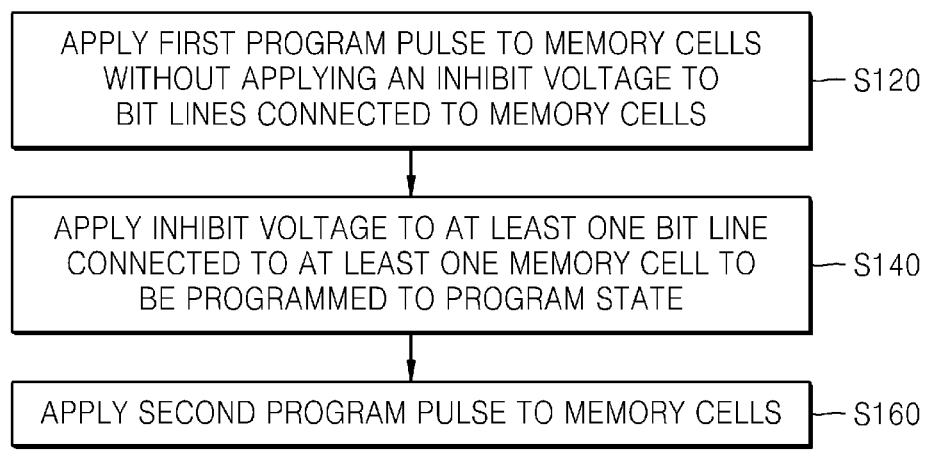
FIG. 1 is a flowchart illustrating a programming method for a nonvolatile memory device according to an embodiment of the inventive concept.
Figure 2A:
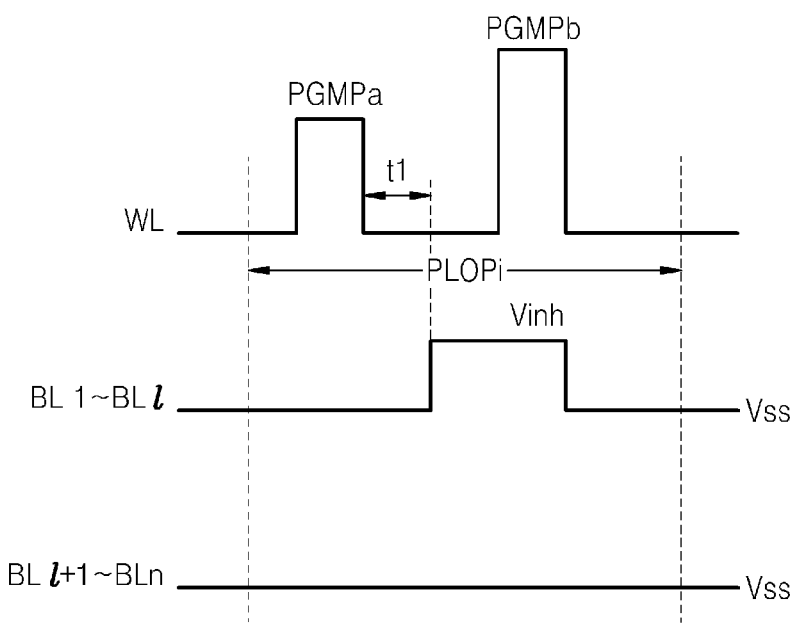
FIGS. 2A and 2B are graphs for describing voltages applied to a wordline and a bitline of a nonvolatile memory device according to the programming method of FIG. 1.
Figure 2B:
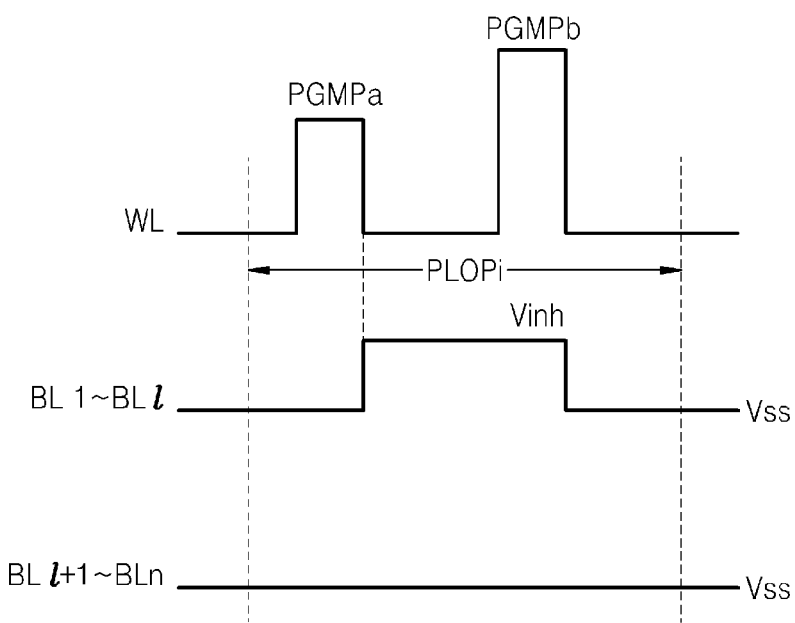

FIG. 1 is a flowchart illustrating a programming method for a nonvolatile memory device according to an embodiment of the inventive concept, and FIGS. 2A and 2B are graphs for describing voltages applied to a wordline and a bitline of the nonvolatile memory device according to the programming method of FIG. 1. In the description that follows, example method steps are indicated by parentheses.

Referring to FIG. 1, the programming method comprises applying a first program pulse PGMPa to selected memory cells to be programmed to first through n-th program states without applying an inhibit voltage Vinh to bitlines BL1 through BLn connected to the selected memory cells (S120). This is illustrated in FIGS. 2A and 2B, in which the timing of inhibit voltage Vinh does not overlap that of first program pulse PGMPa. In the description that follows, BL1 represents a bitline connected to a memory cell to be programmed to the first program state, BL2 represents a bitline connected to a memory cell to be programmed to a second program state, BLn represents a bitline connected to a memory cell to be programmed to the n-th program state, and so on.

The method further comprises applying inhibit voltage Vinh to at least one bitline connected to at least one of the selected memory cells, and subsequently applying a second program pulse PGMPb to the selected memory cells (S160). Additional details of operations S120, S140, and S160 are provided below.

The programming method of FIG. 1 can be used in a NAND flash memory device, for example. Each memory cell in the NAND flash memory device can be programmed or inhibited according to respective voltages applied to a corresponding wordline and a bitline. In addition, during programming of a selected memory cell, other related memory cells or transistors may be controlled using predetermined voltages. The related memory cells or transistors may include, for instance, string select transistors, ground select transistors, and other memory cells in the same string as the selected memory cell. The related memory cells and transistors may be controlled using various techniques that will be apparent to those skilled in the art having the benefit of this description. Accordingly, a detailed explanation of these and other features will be omitted for the sake of brevity.

Figure 3A:
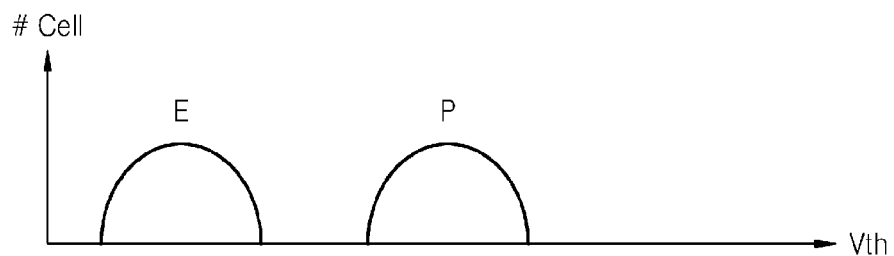
FIGS. 3A and 3B are graphs showing threshold voltage distributions of memory cells in a single-level cell flash memory device and a multi-level cell flash memory device, respectively.
Figure 3B:
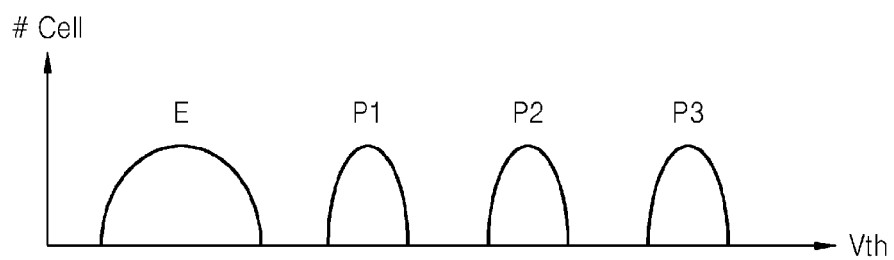

The NAND flash memory device may be a single-level cell flash memory device that stores 1-bit data in memory cells using threshold voltage states such as those illustrated in FIG. 3A. Alternatively, the NAND flash memory device may be a multi-level cell flash memory device that stores, e.g., 2-bit data in memory cells using threshold voltage states such as those illustrated in FIG. 3B. In the example of FIG. 3A, 1-bit data is stored using threshold voltage states E and P, which may correspond to data "1" and "0", respectively. In the example of FIG. 3B, 2-bit data is stored using threshold voltage states E, P1, P2, and P3, which may correspond to data "11", "10", "00", and "01". More generally, k-bit data can be stored using an erase state and "n" program states, where $n=2^k-1$.

Figure 4:
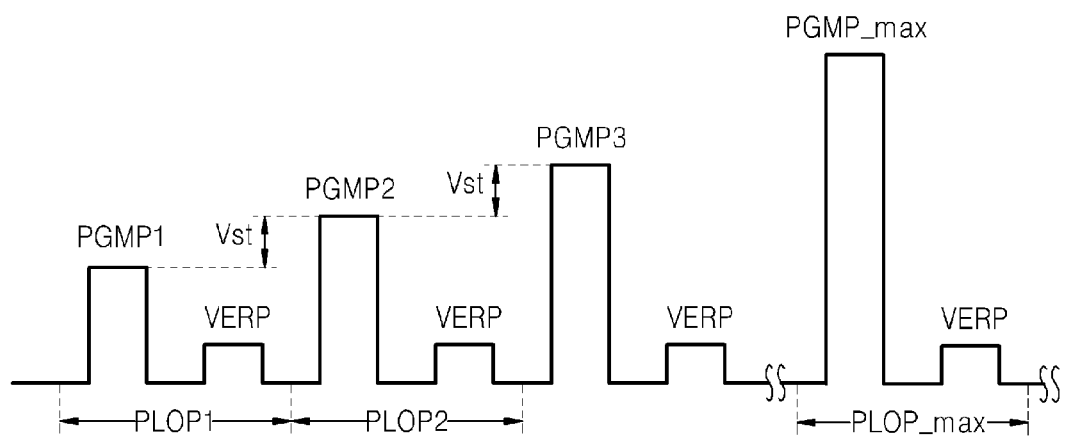
FIG. 4 is a graph for describing an incremental step pulse program (ISPP) method.

The NAND flash memory device performs programming in page units. As shown in FIG. 4, a plurality of program loops PLOP1 through PLOP_max are used to program memory cells in one page using an ISPP method. The ISPP method sequentially increases voltage levels of respective program pulses PGMP1 through PGMP_max applied to a wordline according to program loops PLOP1 through PLOP_max. In other words, it increases program pulse PGMP1 in each program loop, it increases program pulse PGMP2 in each program loop, and so on.

FIG. 4 is a graph for describing an ISPP method. In the ISPP method of FIG. 4, a program pulse is increased by a step voltage Vst in successive program loops. Each program loop PLOP1 through PLOP_max−1 comprises a corresponding program pulse among program pulses PGMP1 through PGMP_max and a verification pulse VERP. Verification pulse VERP is typically omitted from program loop PLOP_max because the ISPP method may terminate regardless of a verification result following application of program pulse PGMP_ max.

Although FIG. 4 shows program pulses PGMP1 through PGMP_max respectively applied to program loops PLOP1 through PLOP_max, an alternative method may include multiple program pulses in each program loop. For example, in FIGS. 1, 2A, and 2B, programming of multiple program states may be accomplished using first and second program pulses PGMPa and PGMPb in different program loops.

Referring again to FIGS. 1, 2A, and 2B, at least one program state can be programmed by each of first and second program pulses PGMPa and PGMPb. For example, first program pulse PGMPa can be applied to a selected wordline connected to program a first memory cell to a program state corresponding to one of the first through l-th program states, where l is an integer from 1 to n−1. Also, second program pulse PGMPb can be applied to the selected wordline to program a second memory cell to a program state corresponding to one of the 1+l-th through n-th program states.

A programming operation performed in a predetermined program loop PLOPi is described in further detail below. Where the maximum number of program loops for each page is j, where j is an integer greater than or equal to 2, i is a predetermined integer between 1 and j.

First, first program pulse PGMPa is applied to a wordline WL, in operation S120. Here, the inhibit voltage is not applied to bitlines BL1 through BLn connected to the memory cells to be programmed. As described above in relation to FIG. 2, BL1 represents a bitline connected to the memory cell to be programmed to the first program state, and BLn represents a bitline connected to the memory cell to be programmed to the n-th program state. A ground Vss is applied to a bitline to which inhibit voltage Vinh is not applied. In this and other embodiments described herein, ground Vss is used as an example of a program permission voltage to be applied to bitlines connected to memory cells to be programmed. Nevertheless, other voltages can be used as the program permission voltage. In addition, to program different program states using the same program pulse, different voltages may be applied to a bitline connected to a memory cell to be programmed to a different program state while the corresponding program pulse is applied. Moreover, a bitline may be forced to a predetermined small voltage level instead of ground Vss so as to vary a threshold voltage of a memory cell of the NAND flash memory device.

Figure 16:
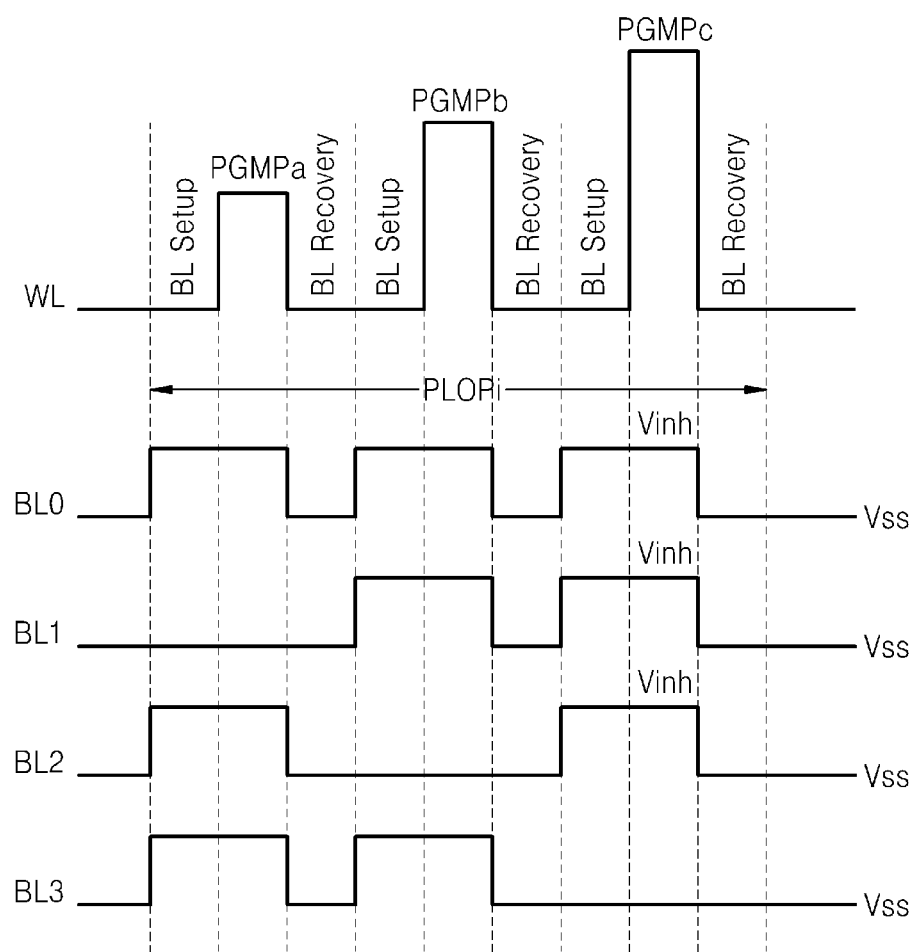
FIG. 16 is a diagram for describing a programming method for a nonvolatile memory device having high power consumption.

Before first program pulse PGMPa is deactivated and second program pulse PGMPb is applied, inhibit voltage Vinh is applied to the bitlines (hereinafter, referred to as corresponding bitlines) BL1 through BLl connected to the memory cells programmed by first program pulse PGMPa, in operation S140. An operation of applying inhibit voltage Vinh to the corresponding bitlines BL1 through BLl of first program pulse PGMPa is called a bitline setup operation. In this programming method, the operation of applying inhibit voltage Vinh to the corresponding bitlines BL1 through BLl, i.e., the bitline setup operation, may be performed after a predetermined time t1 after first program pulse PGMPa is deactivated, as shown in FIG. 2A, or immediately after first program pulse PGMPa is deactivated as, shown in FIG. 2B. The predetermined time t1 in FIG. 2A may be a time set for a bitline recovery operation that decreases a bitline having a voltage level of inhibit voltage Vinh to a voltage level of ground Vss, as will be described below with reference to FIG. 16. According to this programming method, the bitline recovery operation is skipped, and thus, a following operation (bitline setup operation) can be immediately performed without considering a time set for the corresponding operation, as shown in FIG. 2B. For convenience of description, the bitline setup operation is performed after the predetermined time t1 after first program pulse PGMPa is deactivated, as shown in FIG. 2A.

Second program pulse PGMPb is applied after inhibit voltage Vinh is applied to the corresponding bitlines BL1 through BLl, in operation S160. Accordingly, a programming operation is performed on memory cells connected to bitlines BLl+1 through BLn corresponding to second program pulse PGMPb as second program pulse PGMPb does not change a threshold voltage of the memory cells connected to the corresponding bitlines BL1 through BL1. The corresponding bitlines BL1 through BLl to which inhibit voltage Vinh is applied may be decreased to the voltage level of ground Vss after second program pulse PGMPb is deactivated.

Figure 5:
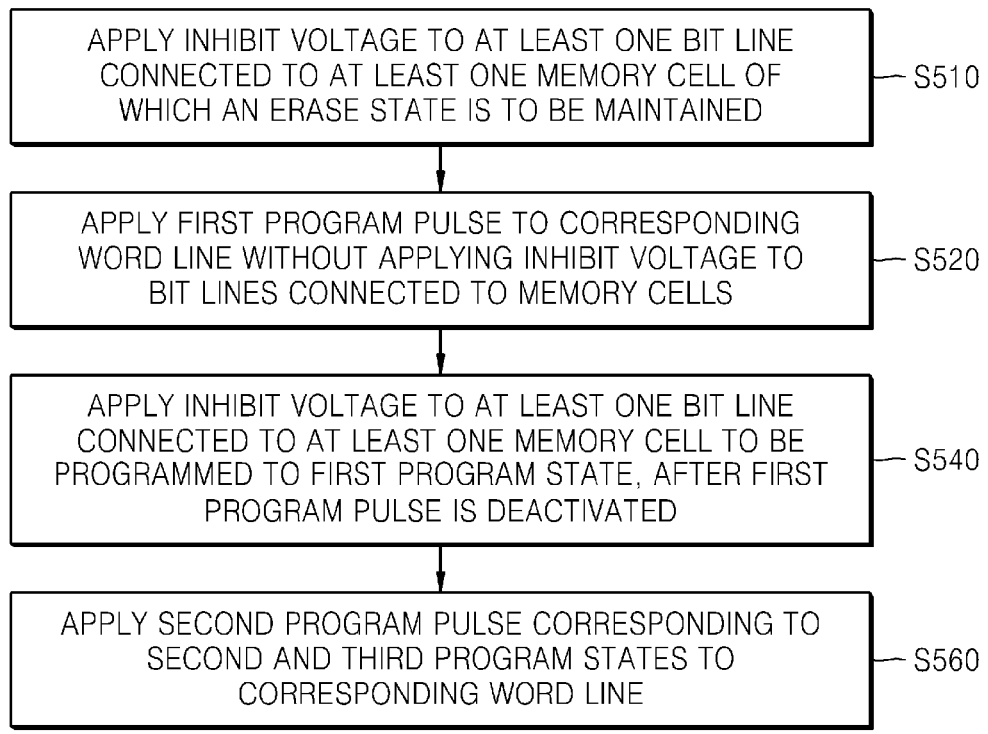
FIG. 5 is a flowchart illustrating a programming method of a 2-bit multi-level cell flash memory device according to an embodiment of the inventive concept.
Figure 6:
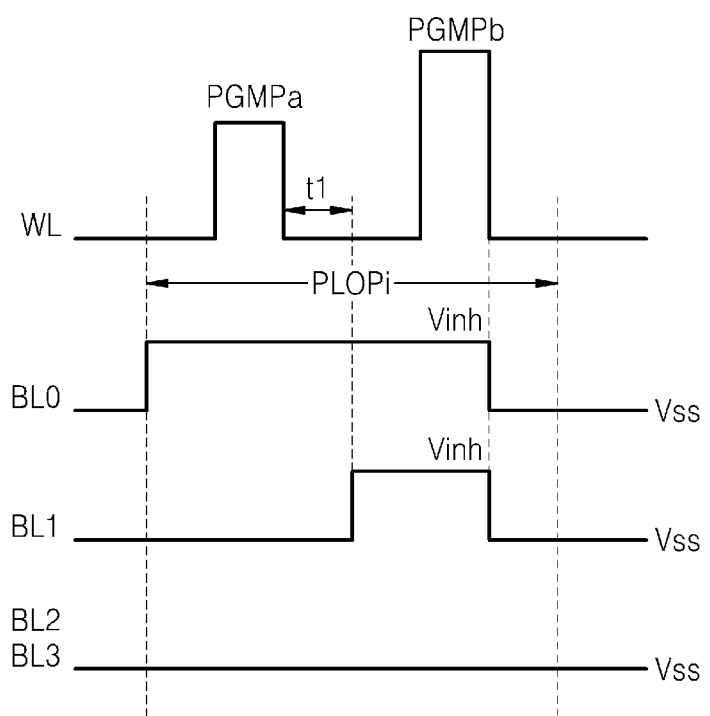
FIG. 6 is a graph for describing voltages applied to a wordline and a bitline of a 2-bit multi-level cell flash memory device according to the programming method of FIG. 5.

FIG. 5 is a flowchart illustrating a programming method of a 2-bit multi-level cell flash memory device according to an embodiment of the inventive concept and FIG. 6 is a graph for describing voltages applied to a wordline and a bitline of a 2-bit multi-level cell flash memory device according to the programming method of FIG. 5. The method of FIG. 5 is a variation of the programming method of FIG. 1, and it will be described with respect to a multi-level cell flash memory device storing 2-bits in each memory cell as shown in FIG. 3B.

Referring to FIGS. 3B, 5, and 6, upon starting a predetermined program loop PLOPi, inhibit voltage Vinh is applied to the bitline BL0 connected to a memory cell of which an erase state E is to be maintained (S510). Then, first program pulse PGMPa is applied to the corresponding wordline WL while inhibit voltage Vinh is not applied to bitlines BL1 through BL3 connected to the memory cells to be programmed to first through third program states P1 through P3 (S520). Instead, ground Vss is applied to bitlines BL1 through BL3 connected to the memory cells to be programmed to first through third program states P1 through P3.

After first program pulse PGMPa is deactivated, inhibit voltage Vinh is applied to bitline BL1 connected to the memory cell to be programmed to first program state P1 corresponding to first program pulse PGMPa (S540). The memory cell is programmed to the first program state P1 by first program pulse PGMPa. However, a fast cell in the first program state P1 may be programmed, whereas a slow cell may not be programmed. The fast cell can be a memory cell located in front of distribution P1, i.e., at a side where a threshold voltage is low. The slow cell can be a memory cell located at the back of distribution P1, i.e., at a side where a threshold voltage is high) the distribution P1. The slow cell can be programmed by first program pulse PGMPa in an additional program loop.

Next, referring to FIGS. 3B, 5, and 6, second program pulse PGMPb corresponding to second and third program states P2 and P3 are applied to the corresponding wordline WL (S560). Bitline BL0, which is connected to the memory cell in erase state E, and bitline BL1, which is connected to the memory cell to be programmed to the first program state P1, maintain the voltage level of inhibit voltage Vinh until second program pulse PGMPb is deactivated.

For explanation purposes, it is assumed that first through third program states P1 through P3 are program states corresponding to data values of "10", "00", and "01". Here, first program pulse PGMPa is a program pulse used to program a memory cell to "10", and second program pulse PGMPb is a program pulse used to program a memory cell to "00" and "01". Like the method of FIG. 1, the method of FIG. 5 can use an ISPP method to increase voltages of first and second program pulses PGMPa and PGMPb in successive program loops. An example of the ISPP method is described with reference to FIG. 7.

Figure 7:
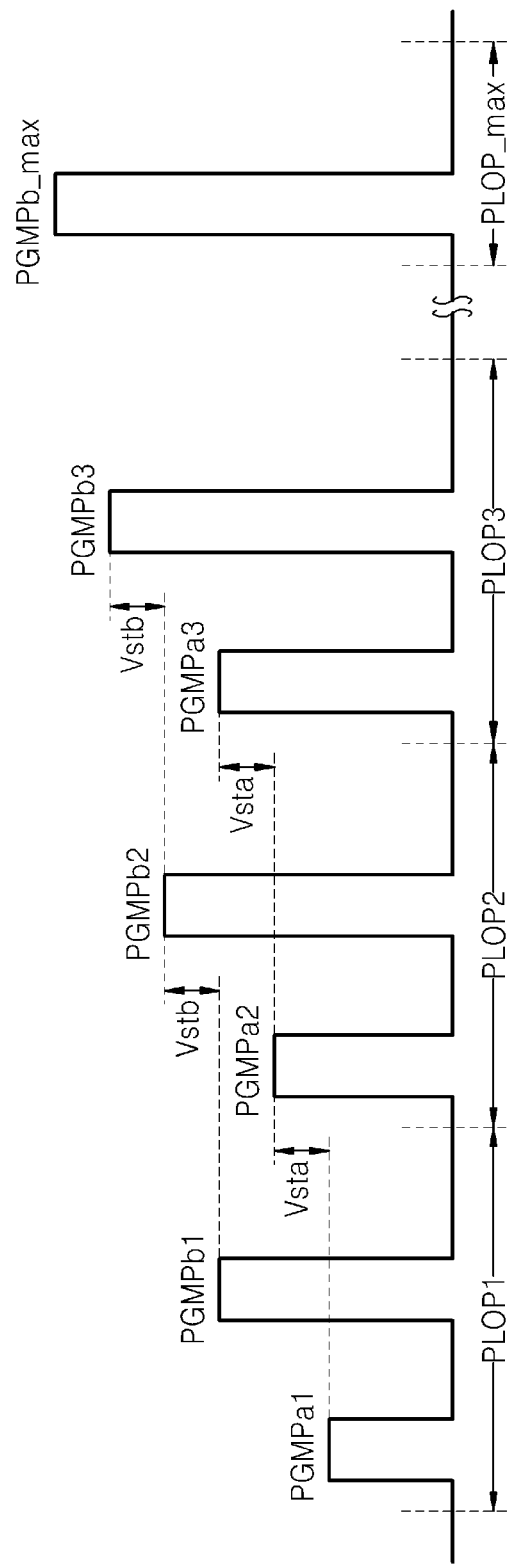
FIG. 7 is a graph for describing an ISPP method according to an embodiment of the inventive concept.

FIG. 7 is a graph for describing an ISPP method according to an embodiment of the inventive concept.

Referring to FIGS. 5 through 7, each of program loops PLOP1 through PLOP_max comprises first and second program pulses PGMPa and PGMPb. Here, verification pulse VERP of FIG. 4, which is typically included in each program loop except for program loop PLOP_max, is omitted from FIG. 7 to simplify the drawings.

Program loop PLMP_max of FIG. 7 does not include first program pulse PGMPa because programming of a program state corresponding to first program pulse PGMPa may be ended before the program loop PLOP_max. For example, if the program loop PLOP_max of FIG. 7 is a $13^{th}$ program loop in one page, all memory cells to be programmed to first program state P1 corresponding to first program pulse PGMPa of FIGS. 3B and 6 may have the corresponding program state when a $10^{th}$ program loop is ended. Under these circumstances, first program pulse PGMPa may not be applied to the corresponding wordline after the $10^{th}$ program loop.

Next, referring to FIGS. 5 through 7, first program pulse PGMPa increases by a first step voltage Vsta to first program pulses PGMPa1 through PGMPa3 according to program loops PLOP1 through PLOP3. Similarly, second program pulse PGMPb increases by a second step voltage Vstb to second program pulses PGMPb1 through PGMPb_max according to the program loops PLOP1 through PLOP_max.

First and second step voltages Vsta and Vstb may be identical to or different from each other. Also, a pulse width pwa of first program pulse PGMPa and a pulse width pwb of second program pulse PGMPb may be identical to or different from each other.

Figure 8:
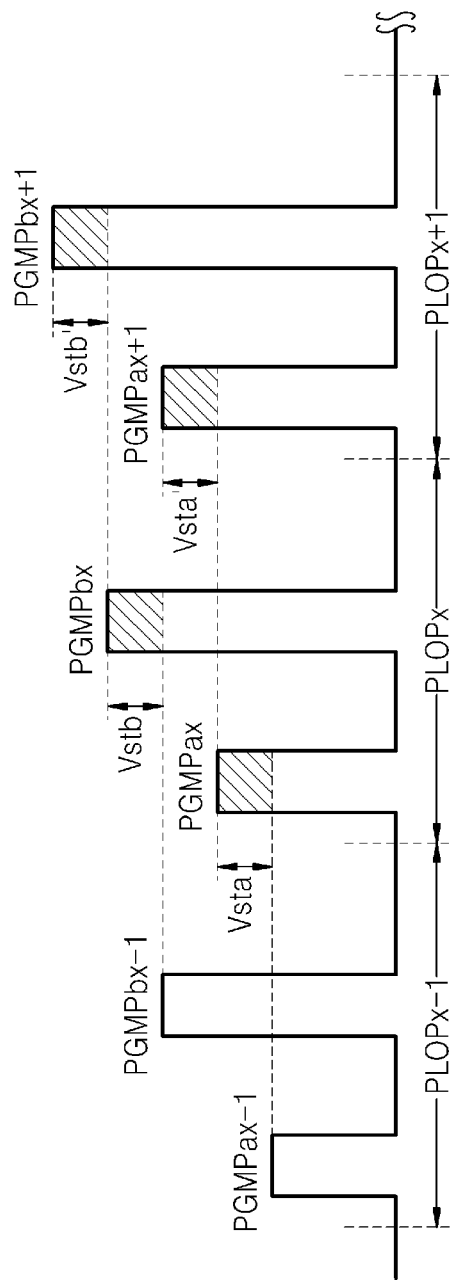
FIGS. 8 through 10 are graphs for describing various ISPP methods for compensating for changes of threshold voltage distributions according to embodiments of the inventive concept.

In the example of FIG. 7, the increasing sizes of first and second step voltages Vsta and Vstb vary according to program loops PLOP1 through PLOP_max. For instance, as shown in FIG. 8, a first step voltage Vsta may be larger than a first step voltage Vsta'. First step voltage Vsta indicates a difference between a first program pulse PGMPax−1 of an x−1th program loop PLOPx−1 and a first program pulse PGMPax of an x-th program loop PLOPx. First step voltage Vsta' indicates a difference between first program pulse PGMPax of x-th program loop PLOPx and a first program pulse PGMPax+1 of an x+1th program loop PLOPx+1. Similarly, a second step voltage Vstb is larger than a second step voltage Vstb'. Second step voltage Vstb indicates a difference between a second program pulse PGMPbx−1 of the x−1th program loop PLOPx−1 and a second program pulse PGMPbx of the x-th program loop PLOPx. Second step voltage Vstb' indicates a difference between second program pulse PGMPbx of the x-th program loop PLOPx and a second program pulse PGMPbx+1 of the x+1th program loop PLOPx+1. FIG. 8 shows that a change (Vsta'−Vsta) of the first step voltage and a change (Vstb'−Vstb) of the second step voltage are different. Alternatively, the changes may be the same.

Figure 9:
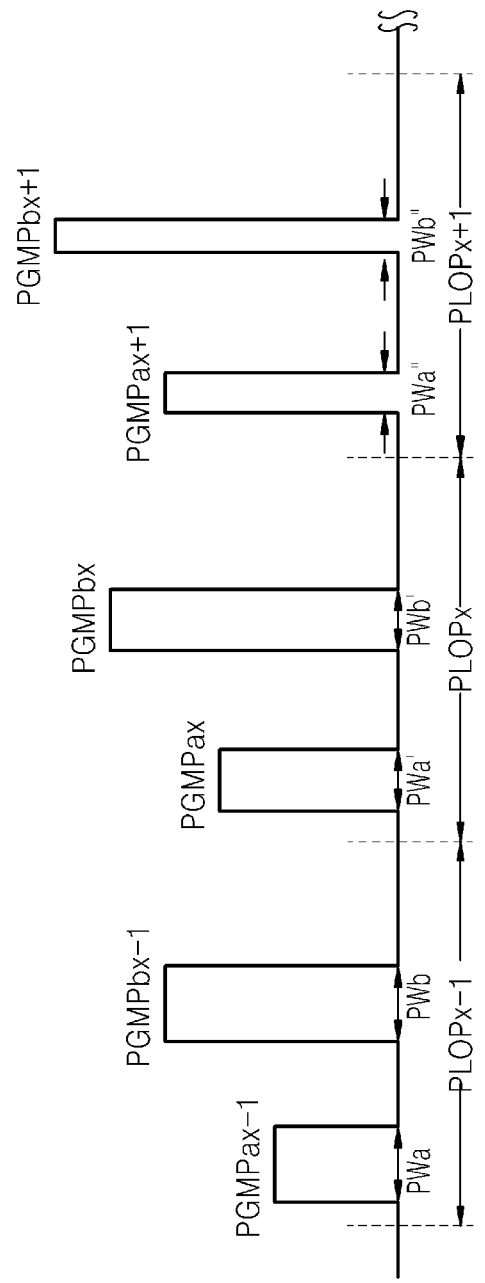

In another example, pulse widths pwa and pwb of first and second program pulses PGMPa and PGMPb vary according to program loops PLOP1 through PLOP_max of FIG. 7. For example, as shown in FIG. 9, pulse width pwa of first program pulse PGMPax−1 of the x−1th program loop PLOPx−1 is wider than a pulse width pwa' of first program pulse PGMPax of x-th program loop PLOPx. Also, pulse width pwa' of first program pulse PGMPax of x-th program loop PLOPx is wider than a pulse width pwa" of first program pulse PGMPax+1 of the x+1th program loop PLOPx+1. Similarly, pulse width pwb of second program pulse PGMPbx−1 of the x−1th program loop PLOPx−1 is wider than a pulse width pwb' of second program pulse PGMPbx of the x-th program loop PLOPx. Also, pulse width pwb' of second program pulse PGMPbx of x-th program loop PLOPx is wider than a pulse width pwb" of second program pulse PGMPbx+1 of the x+1th program loop PLOPx+1.

FIG. 9 shows that a change (pwa'−pwa or pwa"−pwa') of a pulse width of the first program pulse is the same as a change (pwb'−pwb or pwb"−pwb') of a pulse width of the second program pulse (pwa'−pwa=pwb'−pwb, or pwa"−pwa'=pwb"−pwb'). The inventive concept, however, is not limited to these conditions. For example, as shown in FIG. 10, the change (pwa'−pwa or pwa"−pwa') of the pulse width of the first program pulse may be smaller than the change (pwb'−pwb or pwb"−pwb') of the pulse width of the second program pulse (pwa'−pwa<pwb'−pwb, or pwa'−pwa"<pwb"−pwb').

Figure 10:
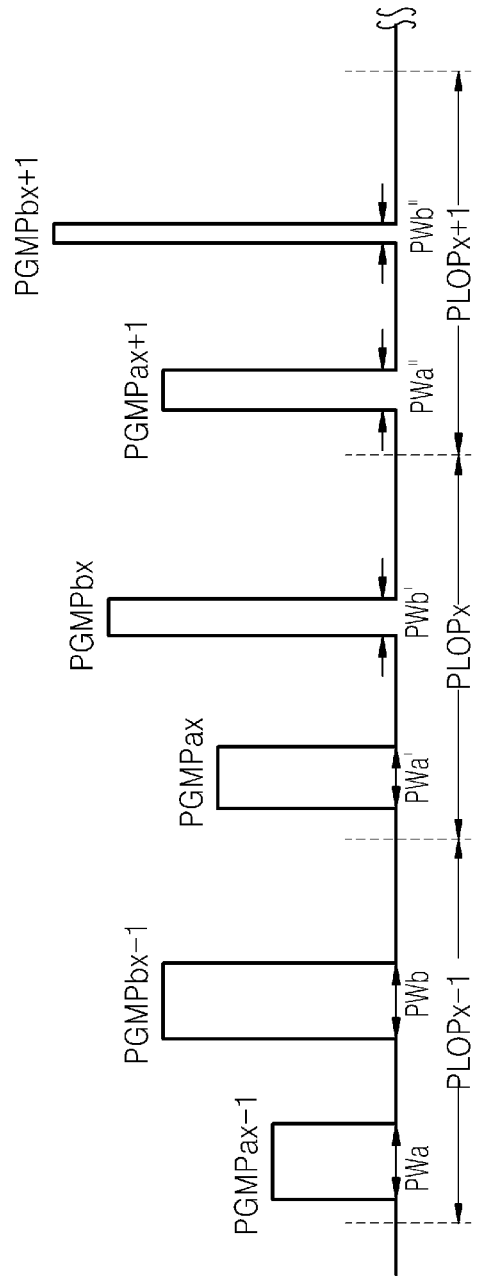

The term "x" in FIGS. 8 through 10 may be an integer between 2 and max−1. Also, the program loops PLOP1 through PLOP_max of FIG. 7 may include at least one program loop having a change of step voltage or pulse width similar to the x-th program loop PLOPx of FIGS. 8 through 10. In addition, according to the programming method of FIG. 5, a step voltage may decrease as a program pulse increases, and/or a pulse width of a program pulse may decrease the program pulse increases. By adjusting the step voltage or the pulse width of a program pulse according to program loops, a change of a cell threshold voltage may be compensated for even if the change occurs before programming due to another program pulse.

Figure 11:
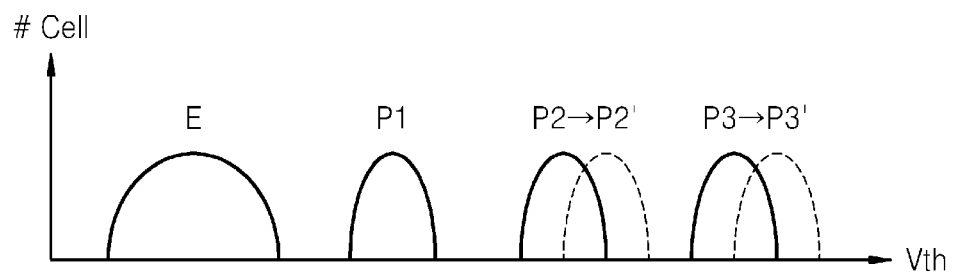
FIG. 11 is a graph for describing a change of threshold voltage distribution to be compensated for in the methods of FIGS. 8 through 10.

In FIGS. 3B and 6, a memory cell may not be programmed by first program pulse PGMPa corresponding to first program state P1, as the second or third program state P2 or P3 corresponding to second program pulse PGMPb has a higher threshold voltage than first program state P1. However, even if the threshold voltage distribution of second or third program state P2 or P3 corresponding to second program pulse PGMPb somewhat changes due to first program pulse PGMPa, for example, even if the distribution of the second or third program state P2 or P3 changes as shown in a dashed line in FIG. 11, the change of the distribution may be compensated for by changing the step voltage according to an increase of program loops or the pulse width of the program pulse, as described above with reference to FIGS. 8 through 10.

Figure 12:
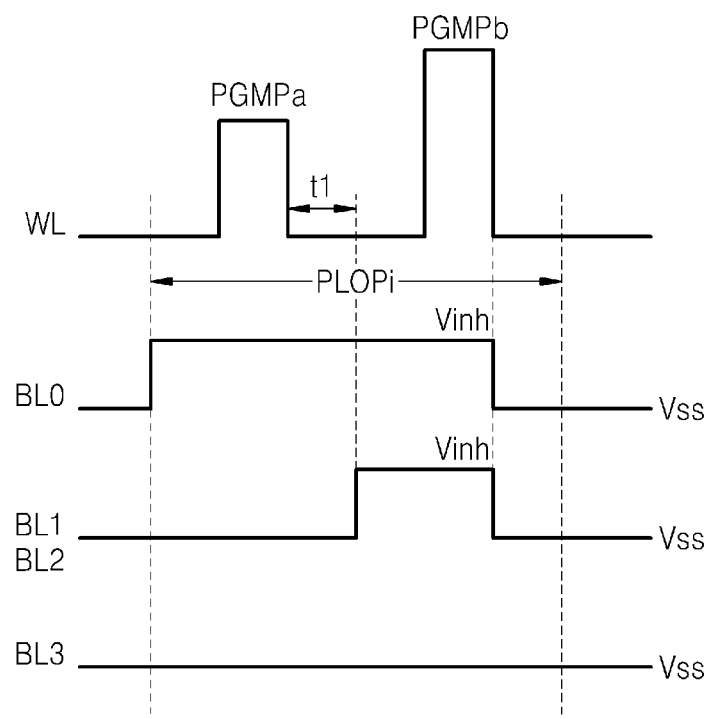
FIG. 12 is a diagram for describing a programming method for a nonvolatile memory device according to another embodiment of the inventive concept.

FIG. 12 is a diagram for describing a programming method in a nonvolatile memory device according to another embodiment of the inventive concept.

In FIG. 6, first program pulse PGMPa is a program pulse applied to wordline WL to program a memory cell to the first program state P1 and second program pulse PGMPb is a program pulse applied to wordline WL to program a memory cell to second or third program state P2 or P3. In contrast, in FIG. 12, first program pulse PGMPa is a program pulse applied to wordline WL to program a memory cell to the first or second program states P1 or P2 and second program pulse PGMPb is a program pulse applied to wordline WL to program a memory cell to third program state P3. As such, in a programming method for a 2-bit multi-level cell flash memory device having 3 program states, first program pulse PGMPa may be used for one program state (e.g., first program state P1) and second program pulse PGMPb may be used for two program states (e.g., second and third program states P2 and P3). Alternatively, first program pulse PGMPa may be used for two program states (e.g., first and second program states P1 and P2) and second program pulse PGMPb may be used for one program state (e.g., third program state P3).

Figure 13:
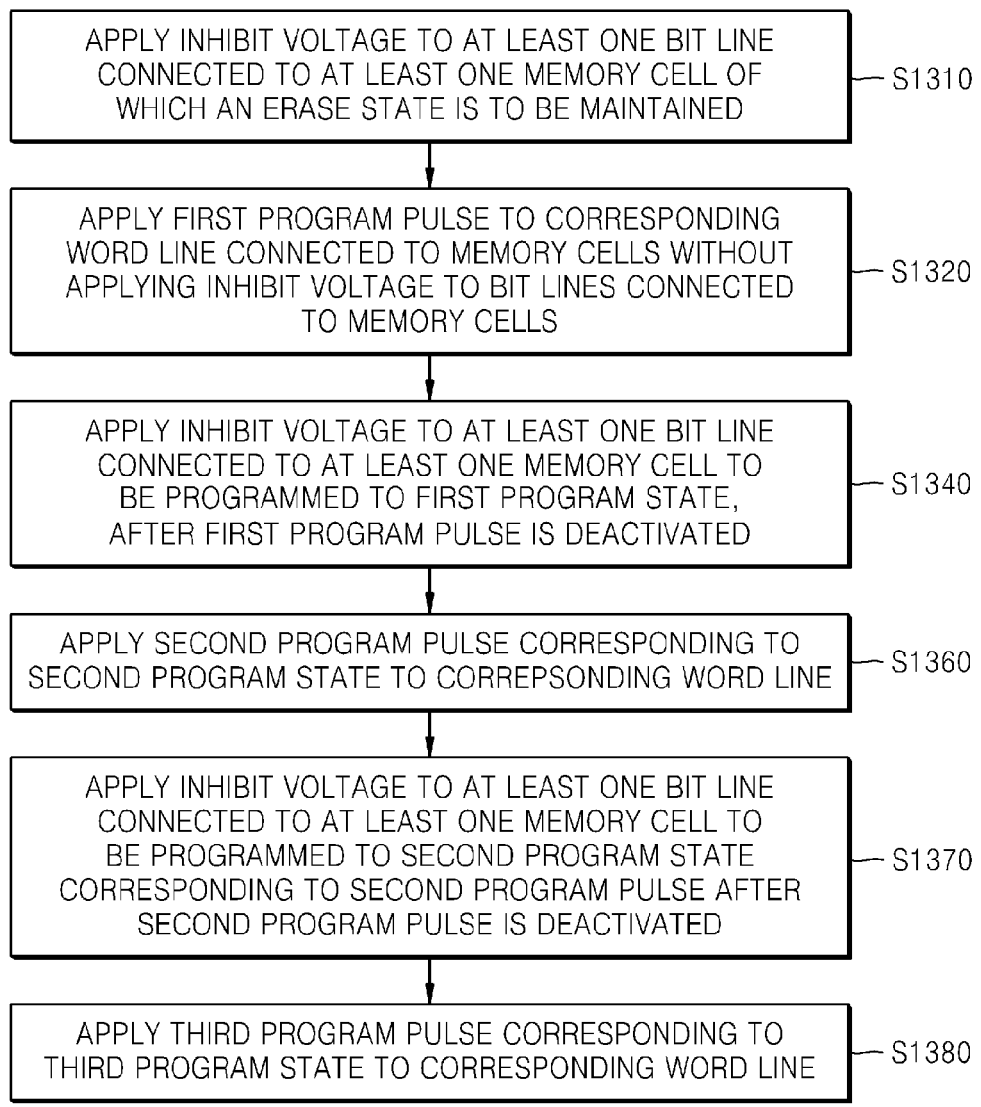
FIG. 13 is a flowchart illustrating a programming method for a 2-bit multi-level cell flash memory device according to another embodiment of the inventive concept.
Figure 14:
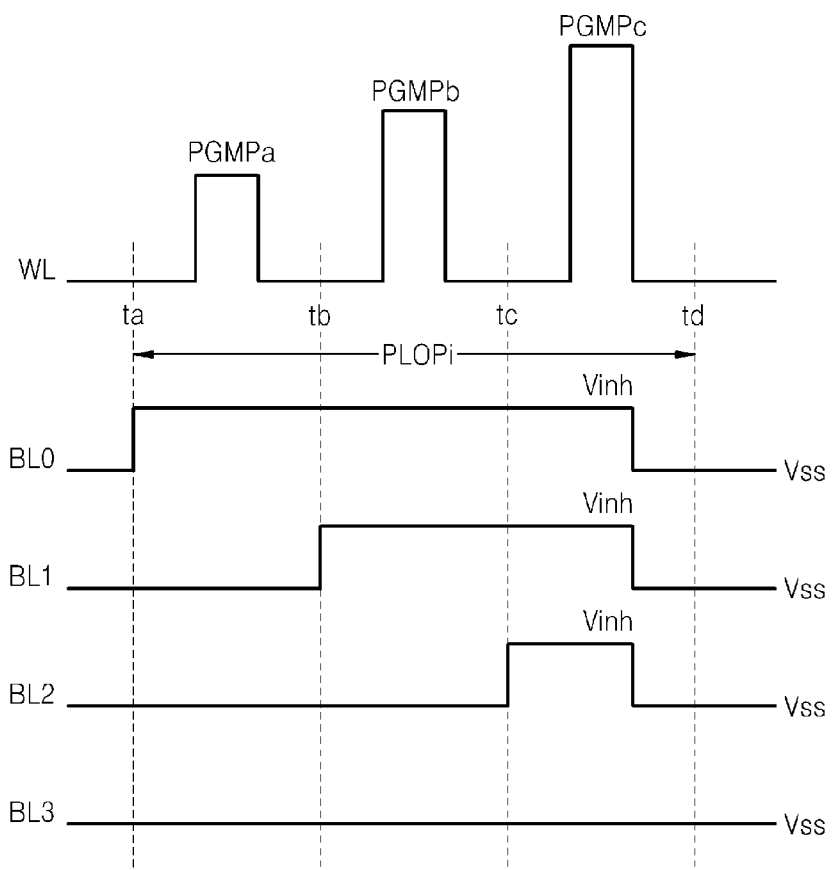
FIG. 14 is a diagram for describing voltages applied to a wordline and a bitline of the 2-bit multi-level cell flash memory device in the programming method of FIG. 13.

FIG. 13 is a flowchart illustrating a programming method for a 2-bit multi-level cell flash memory device according to another embodiment of the inventive concept, and FIG. 14 is a diagram for describing voltages applied to a wordline and a bitline of the 2-bit multi-level cell flash memory device in the programming method of FIG. 13.

Referring to FIGS. 3B, 13, and 14, inhibit voltage Vinh is applied to bitline BL0 connected to a memory cell where an erase state E is to be maintained at a time "ta" marking the beginning of predetermined program loop PLOPi (S1310). Then, first program pulse PGMPa is applied to the corresponding wordline WL without applying inhibit voltage Vinh to bitlines BL1 through BL3 connected to the memory cells to be programmed to the first through third program states P1 through P3 (S1320). During this time, ground Vss is typically applied to bitlines BL1 through BL3 connected to the memory cells to be programmed to first through third program states P1 through P3.

Inhibit voltage Vinh is applied to the bitline BL1 connected to the memory cell to be programmed to the first program state corresponding to first program pulse PGMPa at a time "tb" where a predetermined time has elapsed after deactivation of first program pulse PGMPa (S1340). Then, second program pulse PGMPb corresponding to second program state P2 is applied to wordline WL (S1360).

Further, the programming method as illustrated in FIG. 14 produces third program state P3 by using a separate third program pulse PGMPc rather than second program pulse PGMPb as in FIG. 6. Accordingly, the programming method of FIG. 14 further comprises applying inhibit voltage Vinh to the bitline BL2 connected to the memory cell to be programmed to second program state P2 corresponding to second program pulse PGMPb at a time "tc" where a predetermined time has elapsed after deactivation of second program pulse PGMPb (S1370), and applying the third program pulse PGMPc to the corresponding wordline WL (S1380).

Bitlines BL0 through BL2, which have the voltage level of inhibit voltage Vinh at the times "ta" through "tc" maintain this voltage level up to a time "td" where third program pulse PGMPc is deactivated.

FIGS. 13 and 14 illustrate a programming method for a 2-bit multi-level cell flash memory device, but a similar programming method can be performed to produce at least 7 program states in a multi-level cell flash memory device of at least 3-bits. For example, three program pulses, i.e., first through third program pulses PGMPa through PGMPc, may be sequentially applied to wordline WL, as described with reference to FIGS. 13 and 14, and program states respectively corresponding to first through third program pulses PGMPa through PGMPc may be formed in a 3-bit multi-level cell flash memory device of FIG. 15.

Figure 15:
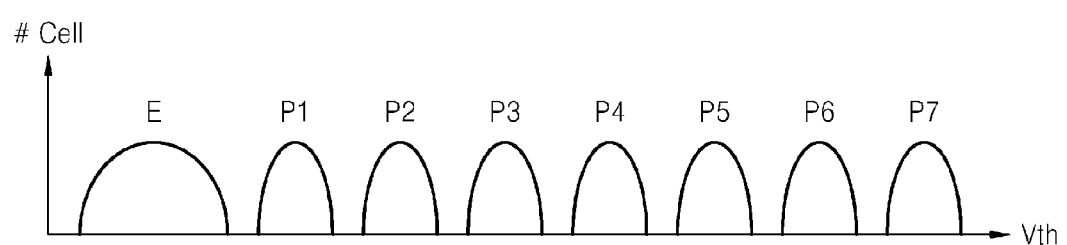
FIG. 15 is a graph showing threshold voltage distribution in a 3-bit multi-level cell flash memory device.

However, because there are more program states in FIG. 15 than in FIG. 3B, one program state is produced by one type of program pulse in FIGS. 13 and 14 in the programming method of FIG. 3B, whereas at least one program state is formed by one type of program pulse in the 3-bit multi-level cell flash memory device of FIG. 15. For example, first and second program states P1 and P2 of FIG. 15 are formed by first program pulse PGMPa of FIG. 14, third and fourth program states P3 and P4 of FIG. 15 are formed by second program pulse PGMPb of FIG. 14, and fifth through seventh program states P5 through P7 of FIG. 15 are formed by the third program pulse PGMPc of FIG. 14. However, the number of program states corresponding to program pulses may be varied.

In the above-described methods, power consumption may be reduced by avoiding application of a program inhibit voltage to certain bitlines under certain circumstances. In addition, the complexity of program operations may be reduced by avoiding performance of a recovery operation on a bitline to which an inhibit voltage is applied after applying a program pulse.

Figure 17:
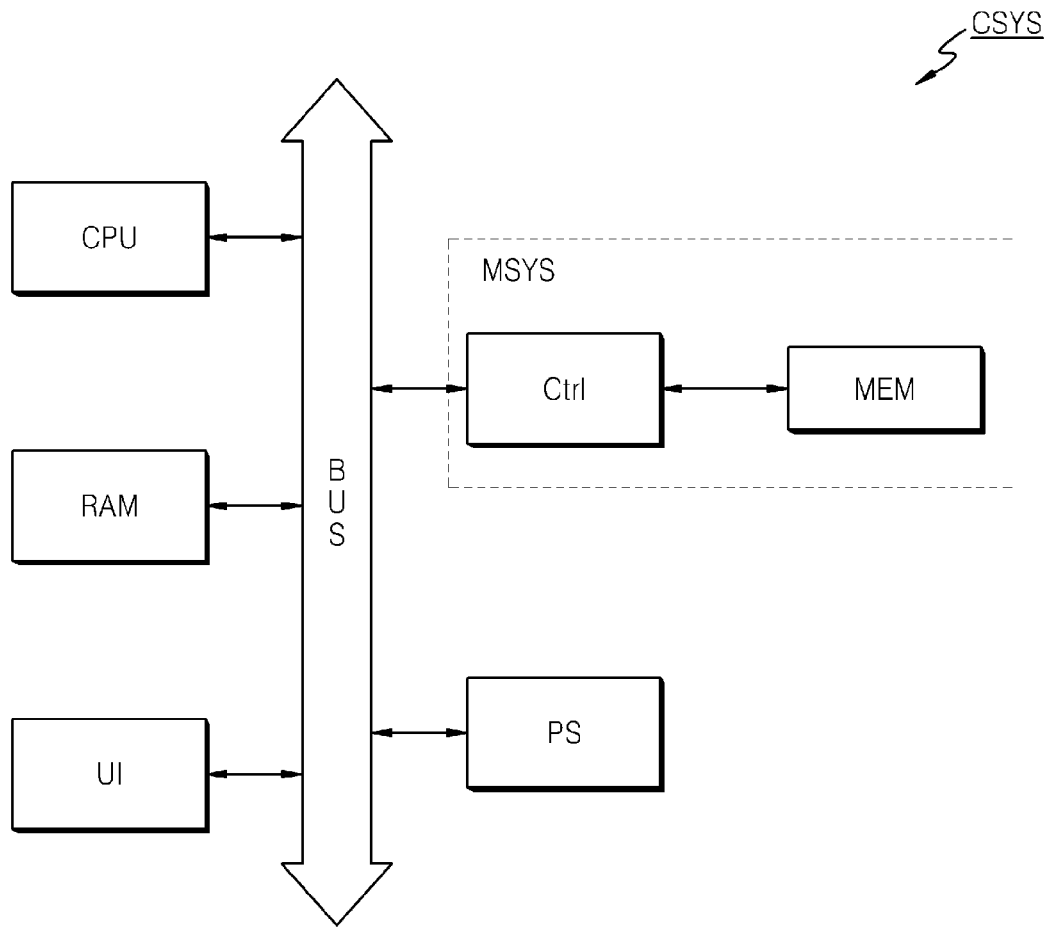
FIG. 17 is a diagram of a computing system according to an embodiment of the inventive concept.

FIG. 17 is a diagram of a computing system CSYS according to an embodiment of the inventive concept.

Referring to FIG. 17, computing system CSYS comprises a processor CPU, a user interface UI, and a semiconductor memory system MSYS, which are electrically connected to a bus BUS. Semiconductor memory system MSYS comprises a memory controller Ctrl and a memory device MEM. N-bit data (N is an integer greater than or equal to 1) processed or to be processed by processor CPU may be stored in memory device MEM through memory controller Ctrl. Memory device MEM can store the N-bit data by performing the programming method of FIG. 1, 5, or 13, for example. This can potentially reduce power consumption of computing system CSYS.

Computing system CSYS further comprises a power supplying device PS. Where memory device MEM is a flash memory device that performs the programming method of FIG. 1, 5, or 13, computing system CSYS may further comprise a volatile memory device such as a random access memory (RAM). Where computing system CSYS is a mobile device, a battery may be provided as power supply PS. Moreover, computing system CYS may include additional components such as a baseband chipset, an application chipset, a camera image processor (CIP), a mobile dynamic random access memory (DRAM), or the like.

Figure 18:
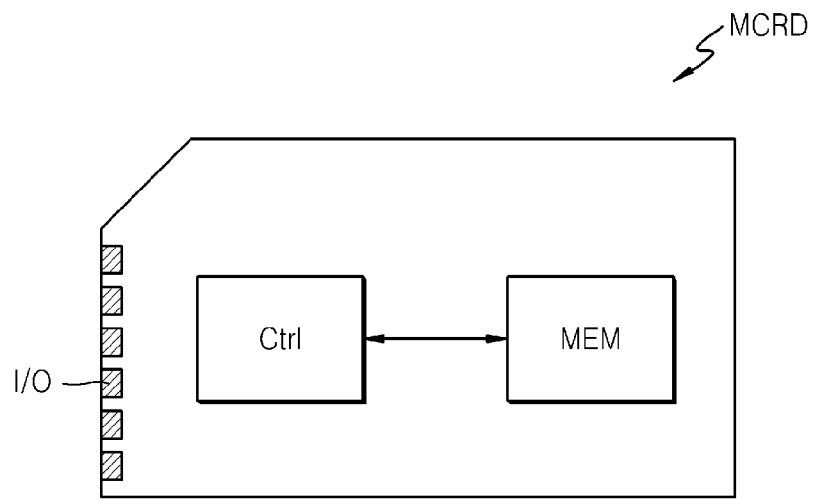
FIG. 18 is a diagram of a memory card according to an embodiment of the inventive concept.

FIG. 18 is a diagram of a memory card MCRD according to an embodiment of the inventive concept.

Referring to FIG. 18, memory card MCRD comprises a memory controller Ctrl and a memory device MEM. Memory controller Ctrl controls writing or reading of data on or from memory device MEM in response to a request from an external host (not shown) received via an input/output unit (I/O). Also, if memory device MEM of FIG. 18 is a flash memory device, memory controller Ctrl may control an erasing operation performed on memory device MEM. To perform such control operations, memory controller Ctrl may include interface units (not shown) respectively interfacing with the external host and memory device MEM, and a RAM. Memory device MEM of memory card MCRD may be a flash memory device, for example. Accordingly, memory card MCRD may reduce power consumption due to programming of memory device MEM. Memory card MCRD can be, for example, a compact flash card (CFC), a microdrive, a smart media card (SMC), a multimedia card (MMC), a security digital card (SDC), a memory stick, or a universal serial bus (USB) flash memory card.

Figure 19:
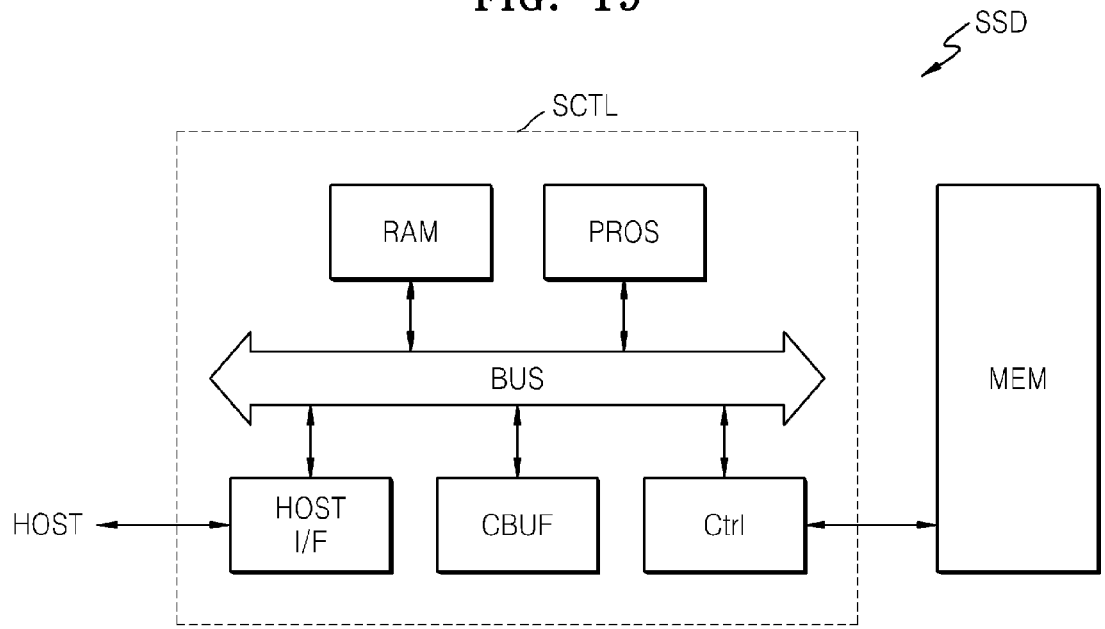
FIG. 19 is a diagram of a solid state drive (SSD) according to an embodiment of the inventive concept.

FIG. 19 is a diagram of a solid state drive (SSD) according to an embodiment of the inventive concept.

Referring to FIG. 19, the SSD comprises an SSD controller SCTL and a memory device MEM. SSD controller SCTL comprises a processor PROS, a RAM, a cache buffer CBUF, and a memory controller Ctrl, which are connected to a bus BUS. Processor PROS controls memory controller Ctrl to receive or transmit data to or from memory device MEM in response to a request from a host. Such a request may include, for instance, a command, address, or data. Processor PROS and memory controller Ctrl of the SSD can be realized in an ARM processor, for instance. Data required for operations of the processor PROS is typically loaded on the RAM.

A host interface HOST I/F transmits data to processor PROS, or it transmits data to the host from memory device MEM upon receiving a request from the host. Host interface HOST I/F typically interfaces with the host using one of various standardized interface protocols, such as an USB, man machine communication (MMC), peripheral component interconnect-express (PCI-E), serial advanced technology attachment (SATA), parallel advanced technology attachment (PATA), small computer system interface (SCSI), enhanced small device interface (ESDI), and intelligent drive electronics (IDE). Data to be transmitted to memory device MEM or received from memory device MEM is temporarily stored in cache buffer CBUF. Cache buffer CBUF typically comprises a static random access memory (SRAM).

Memory device MEM can be a memory device performing the programming method of FIG. 1, 5, or 13, for example. Accordingly, it may provide reduced power consumption compared with conventional technologies.

Figure 20:
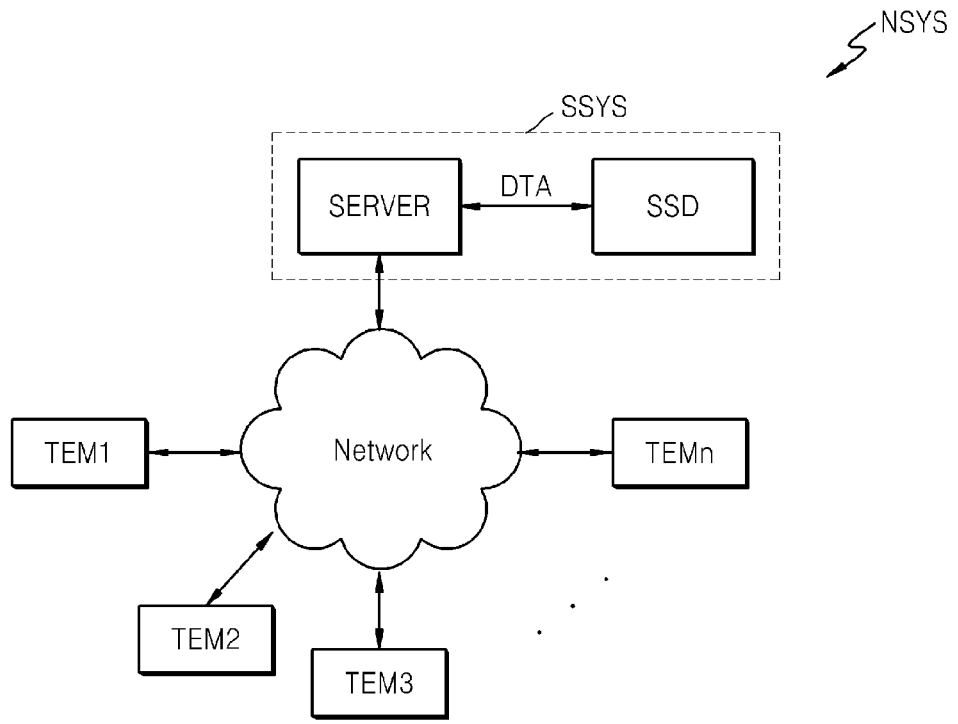
FIG. 20 is a diagram of a server system incorporating the SSD of FIG. 19 and a network system incorporating the server system.

FIG. 20 is a diagram of a server system SSYS incorporating the SSD of FIG. 19 and a network system NSYS incorporating the server system.

Referring to FIG. 20, network system NSYS comprises server system SSYS and a plurality of terminals TEM1 through TEMn, which are connected via a network. Server system SSYS comprises a server SERVER for processing requests received from terminals TEM1 through TEMn connected to the network and an SSD that stores data corresponding to the requests from terminals TEM1 through TEMn. The SSD of FIG. 20 is the same as the SSD of FIG. 19, so it includes the SSD controller SCTL and memory device MEM, where memory device MEM is a flash memory device performing the programming method of FIG. 1, 5, or 13. Consequently, power consumption due to memory device MEM may be reduced in the server system SSYS and network system NSYS of FIG. 20.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of programming a nonvolatile memory device, comprising:
   in each of a plurality of program loops of an incremental step pulse programming (ISPP) process, sequentially applying a first program pulse and a second program pulse to a wordline connected to selected memory cells, wherein each of the first and second program pulses corresponds to one of first through n-th program states of the selected memory cells;
   during application of the first program pulse to the wordline, applying a program permission voltage to a first bitline connected to a first memory cell among the selected memory cells;
   subsequent to application of the first program pulse to the wordline, applying an inhibit voltage to the first bitline; and
   during application of the inhibit voltage to the first bitline, applying the second program pulse to the wordline and applying the program permission voltage to a second bitline connected to a second memory cell among the selected memory cells,
   wherein, in each of the plurality of the program loops, the applying the inhibit voltage to the first bitline is performed once, and applying the inhibit voltage to the second bitline is not performed.

2. The method of claim 1, wherein the program permission voltage is ground.

3. The method of claim 1, wherein n=3, the first program pulse is a program pulse for programming a memory cell to the first program state, and the second program pulse is a program pulse for programming a memory cell to a second or third program state.

4. The method of claim 3, wherein the first through third program states are program states for respective data values of "10", "00", and "01", the first program pulse is adapted to program a memory cell to "10", and the second program pulse is adapted to program a memory cell to "00" and "01".

5. The method of claim 1, wherein n=3, the first program pulse is a program pulse for programming a memory cell to the first program state or a second program state, and the second program pulse is a program pulse for programming a memory cell to a third program state.

6. The method of claim 1, further comprising, before application of the first program pulse to the wordline, applying the inhibit voltage to a third bitline connected to a third memory cell to be maintained in an erase state.

7. The method of claim 1, further comprising skipping a bitline recovery operation following application of the first program pulse to the wordline, and performing a bitline recovery operation following application of the second program pulse to the wordline.

8. The method of claim 1, wherein the first and second program pulses are incrementally increased by respective step voltages in each of the program loops.

9. The method of claim 8, wherein a step voltage between an (x−1)-th program loop and an x-th program loop is smaller than a step voltage between the x-th program loop and an (x+1)-th program loop.

10. The method of claim 8, wherein the step voltage of the first program pulse is different from the step voltage of the second program pulse.

11. The method of claim 8, wherein respective pulse widths of the first and second program pulses in an x-th program loop are narrower than respective pulse widths of the first and second program pulses in an (x+1)-th program loop.

12. The method of claim 11, wherein a difference between pulse widths of the first program pulse in the x-th program loop and the (x+1)-th program loop is smaller than a difference between pulse widths of the second program pulse in the x-th program loop and the (x+1)-th program loop.

13. The method of claim 1, further comprising:
   following application of the second program pulse, applying the inhibit voltage to the second bitline, and during application of the inhibit voltage to the second bitline, applying a third program pulse to the wordline, wherein the third program pulse is adapted to program a third memory cell to one of an (n+1)-th program state through an m-th program state, where m is greater than n.

14. The method of claim 13, further comprising continuing to apply the inhibit voltage to the first bitline until deactivation of the second program pulse.

15. The method of claim 1, wherein the nonvolatile memory device is a multi-level cell NAND flash memory device.

16. A method of programming a nonvolatile memory device, comprising:
   performing a plurality of program loops each comprising sequentially applying first through n-th program pulses (n>1) to a selected wordline connected to a page of memory cells to be programmed, and incrementing each of the first through n-th program pulses prior to a next program loop, wherein the first through n-th program pulses are used to program selected memory cells to respective first through m-th (m≥1) program states; and
   during application an program pulse among the first through n-th program pulses to the selected wordline, applying one of a program permission voltage and a program inhibit voltage to bitlines connected to the selected memory cells, wherein, in each of a plurality of the program loops, the program inhibit voltage is applied to the bitlines once or not,
   wherein, during application of an i-th program pulse among the first through n-th program pulses (1<i<n), the applying one of the program permission voltage and the program inhibit voltage to bitlines comprises applying a program inhibit voltage to bitlines connected to selected memory cells to be programmed to first through (j−1)-th program states (1<j<m) wherein the i-th program pulse is used to program selected memory cells to at least one of j-th program state to a j+l-th program state 1<l≤m−j), and applying a program permission voltage to bitlines connected to selected memory cells to be programmed to the j-th through m-th program states.

17. The method of claim 16, further comprising:
   performing a bitline recovery operation following application of at least one of the second through n-th program pulses and omitting the bitline recovery operation following application of the first program pulse.

18. The method of claim 16, further comprising incrementing the voltage level of the first through n-th program pulses by different voltage step sizes in successive program loops.

19. The method of claim 16, wherein at least two of the first through n-th program pulses have different pulse widths.

20. A nonvolatile memory device, comprising: a memory cell array comprising a plurality of memory cells; and a controller configured to perform a plurality of program loops each comprising sequentially applying first through n-th program pulses (n>1) to a selected wordline connected to a page of memory cells to be programmed, and during application an program pulse among the first through n-th program pulses to the selected wordline, applying one of a program permission voltage and a program inhibit voltage to bitlines connected to the memory cells, wherein, in each of a plurality of the program loops, the program inhibit voltage is applied to each bitlines once or not, wherein the first through n-th program pulses are used to program selected memory cells to respective first through m-th program states ($1 \leq m$), wherein, during application of an i-th program pulse among the first through n-th program pulses ($1 < i < n$), the applying one of the program permission voltage and the program inhibit voltage to bitlines comprises applying a program inhibit voltage to bitlines connected to selected memory cells to be programmed to first through (j−1)-th program states ($1 < j < m$), wherein the i-th program pulse is used to program selected memory cells to at least one of j-th program state to j+l-th program state ($1 < l \leq m-j$), and applying a program permission voltage to bitlines connected to memory cells to be programmed to the j-th through m-th program states.

* * * * *